United States Patent [19]

Jackson et al.

[11] Patent Number: 4,560,981
[45] Date of Patent: Dec. 24, 1985

[54] LOGIC WAVEFORM DISPLAY APPARATUS

[75] Inventors: Ronald M. Jackson; Daniel C. Olin, both of Portland; Russell Y. Anderson, Hillsboro, all of Oreg.

[73] Assignee: Tektronix, Inc., Beaverton, Oreg.

[21] Appl. No.: 478,180

[22] Filed: Mar. 23, 1983

[51] Int. Cl.[4] ............................................. G06F 3/14
[52] U.S. Cl. ................................. 340/747; 340/721; 340/744; 340/799
[58] Field of Search .............. 340/720, 721, 732, 733, 340/744, 747, 798, 799, 805; 371/29

[56] References Cited

U.S. PATENT DOCUMENTS

| 4,107,651 | 8/1978 | Martin | 371/29 |
| 4,250,562 | 2/1981 | Haag et al. | 340/747 |
| 4,364,036 | 12/1982 | Shimizu | 340/721 |
| 4,425,643 | 1/1984 | Chapman et al. | 340/721 |

*Primary Examiner*—Gerald L. Brigance
*Assistant Examiner*—Jeffery A. Brier
*Attorney, Agent, or Firm*—Robert S. Hulse; George T. Noe

[57] ABSTRACT

Disclosed herein is an apparatus for displaying a logic waveform on a raster scan display device such as a CRT. A part of an input logic signal is delayed for forming a former bit, and the input logic signal acts as a present bit. A memory device stores a special pattern determined in accordance with results of logic operation of the present and former bits. An image dot of the pattern is addressed by the present and former bits and raster line position (number) information, and the output therefrom is applied as an intensity control signal to the display device. Since the memory device does not need FONT information, this invention needs very little software manipulation of data, and the capacity of the memory device is small. In addition, this invention can display glitches and graticule tick marks.

7 Claims, 13 Drawing Figures

| L2 (A4) | L1 (A3) | L0 (A2) | PRESENT BIT (A1) | 0 | 0 | 1 | 1 |
|---|---|---|---|---|---|---|---|
| | | | FORMER BIT (A0) | 0 | 1 | 0 | 1 |
| 0 | 0 | 0 | | 0 | 0 | 0 | 0 |
| 0 | 0 | 1 | | 0 | 1 | 1 | 1 |
| 0 | 1 | 0 | | 0 | 1 | 1 | 0 |
| 0 | 1 | 1 | | 0 | 1 | 1 | 0 |
| 1 | 0 | 0 | | 0 | 1 | 1 | 0 |
| 1 | 0 | 1 | | 0 | 1 | 1 | 0 |
| 1 | 1 | 0 | | 1 | 1 | 1 | 0 |
| 1 | 1 | 1 | | 0 | 0 | 0 | 0 |

| L2 L1 L0 (A4)(A3)(A2) | PRESENT BIT (A1) | 0 | 0 | 1 | 1 |
|---|---|---|---|---|---|
| | FORMER BIT (A0) | 0 | 1 | 0 | 1 |
| 0 0 0 | | 0 | 0 | 0 | 0 |
| 0 0 1 | | 0 | 0 | 0 | 0 |
| 0 1 0 | | 0 | 0 | 1 | 1 |
| 0 1 1 | | 0 | 0 | 1 | 1 |
| 1 0 0 | | 0 | 0 | 1 | 1 |
| 1 0 1 | | 0 | 0 | 1 | 1 |
| 1 1 0 | | 0 | 0 | 0 | 0 |
| 1 1 1 | | 0 | 0 | 0 | 0 |

FIG. 8

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| PRESENT GLITCH BIT (A1) | o | o | o | o | o | o | o | o | — | — | — | — | o | o | o | o | — | — | — | — | — | — | — | — | — | — | — | — | — | — | — | — |
| FORMER GLITCH BIT (A0) | o | o | o | o | — | — | — | — | — | — | — | — | o | o | o | o | o | o | o | o | — | — | — | — | — | — | — | — | — | — | — | — |
| PRESENT TIMING BIT (A3) | o | o | — | — | o | o | — | — | o | o | — | — | — | — | o | o | — | — | o | o | — | — | o | o | o | o | — | — | — | — | o | o |
| FORMER TIMING BIT (A2) | o | — | o | — | o | — | o | — | o | — | o | — | o | — | o | — | o | — | o | — | o | — | o | — | o | — | o | — | o | — | o | — |
| L0 (A4) | o | — | o | — | o | — | o | — | o | — | o | — | o | — | o | — | o | — | o | — | o | — | o | — | o | — | o | — | o | — | o | — |
| L1 (A5) | o | o | — | — | o | o | — | — | o | o | — | — | o | o | — | — | o | o | — | — | o | o | — | — | o | o | — | — | o | o | — | — |
| L2 (A6) | o | o | o | o | — | — | — | — | o | o | o | o | — | — | — | — | o | o | o | o | — | — | — | — | o | o | o | o | — | — | — | — |

| PRESENT BIT (A1) | | | 0 | 0 | 1 | 1 |
|---|---|---|---|---|---|---|
| FORMER BIT (A0) | | | 0 | 1 | 0 | 1 |
| L2 (A4) | L1 (A3) | L0 (A2) | | | | |
| 0 | 0 | 0 | 0 | 0 | 0 | 0 |
| 0 | 0 | 1 | 0 | 1 | 1 | 0 |
| 0 | 1 | 0 | 0 | 1 | 1 | 0 |
| 0 | 1 | 1 | 1 | 1 | 1 | 1 |
| 1 | 0 | 0 | 0 | 1 | 1 | 0 |
| 1 | 0 | 1 | 0 | 1 | 1 | 0 |
| 1 | 1 | 0 | 0 | 0 | 0 | 0 |
| 1 | 1 | 1 | 0 | 0 | 0 | 0 |

| | PRESENT GLITCH BIT (A1) | 0 | 0 | 0 | 0 | 0 | 0 | 0 | 0 | 1 | 1 | 1 | 1 | 1 | 1 | 1 | 1 |
|---|---|---|---|---|---|---|---|---|---|---|---|---|---|---|---|---|---|
| | FORMER GLITCH BIT (A0) | 0 | 0 | 0 | 0 | 1 | 1 | 1 | 1 | 0 | 0 | 0 | 0 | 1 | 1 | 1 | 1 |
| | PRESENT TIMING BIT (A3) | 0 | 0 | 1 | 1 | 0 | 0 | 1 | 1 | 0 | 0 | 1 | 1 | 0 | 0 | 1 | 1 |
| | FORMER TIMING BIT (A2) | 0 | 1 | 0 | 1 | 0 | 1 | 0 | 1 | 0 | 1 | 0 | 1 | 0 | 1 | 0 | 1 |
| GATE L2 L1 L0 (A7)(A6)(A5)(A4) | | | | | | | | | | | | | | | | | |
| 0 0 0 0 | | 0 | 0 | 0 | 0 | 0 | 0 | 0 | 0 | 0 | 0 | 0 | 0 | 0 | 0 | 0 | 0 |
| 0 0 0 1 | | 0 | 1 | 1 | 0 | 0 | 1 | 1 | 0 | 0 | 1 | 1 | 0 | 0 | 1 | 1 | 0 |
| 0 0 1 0 | | 0 | 1 | 1 | 0 | 0 | 1 | 1 | 0 | 0 | 1 | 1 | 0 | 0 | 1 | 1 | 0 |
| 0 0 1 1 | | 1 | 1 | 1 | 1 | 1 | 1 | 1 | 1 | 1 | 1 | 1 | 1 | 1 | 1 | 1 | 1 |
| 0 1 0 0 | | 0 | 1 | 1 | 0 | 0 | 1 | 1 | 0 | 0 | 1 | 1 | 0 | 0 | 1 | 1 | 0 |
| 0 1 0 1 | | 0 | 1 | 1 | 0 | 0 | 1 | 1 | 0 | 0 | 1 | 1 | 0 | 0 | 1 | 1 | 0 |
| 0 1 1 0 | | 0 | 0 | 0 | 0 | 0 | 0 | 0 | 0 | 0 | 0 | 0 | 0 | 0 | 0 | 0 | 0 |
| 0 1 1 1 | | 0 | 0 | 0 | 0 | 0 | 0 | 0 | 0 | 0 | 0 | 0 | 0 | 0 | 0 | 0 | 0 |
| 1 0 0 0 | | 0 | 0 | 0 | 0 | 0 | 0 | 0 | 0 | 0 | 0 | 0 | 0 | 0 | 0 | 0 | 0 |
| 1 0 0 1 | | 0 | 1 | 1 | 1 | 0 | 1 | 1 | 1 | 0 | 1 | 1 | 1 | 0 | 1 | 1 | 1 |
| 1 0 1 0 | | 0 | 1 | 1 | 0 | 0 | 1 | 1 | 0 | 0 | 1 | 1 | 0 | 0 | 1 | 1 | 0 |
| 1 0 1 1 | | 0 | 1 | 1 | 0 | 0 | 1 | 1 | 0 | 0 | 1 | 1 | 0 | 0 | 1 | 1 | 0 |
| 1 1 0 0 | | 0 | 1 | 1 | 0 | 0 | 1 | 1 | 0 | 0 | 1 | 1 | 0 | 0 | 1 | 1 | 0 |
| 1 1 0 1 | | 0 | 1 | 1 | 0 | 0 | 1 | 1 | 0 | 0 | 1 | 1 | 0 | 0 | 1 | 1 | 0 |
| 1 1 1 0 | | 1 | 1 | 1 | 0 | 1 | 1 | 1 | 0 | 1 | 1 | 1 | 0 | 1 | 1 | 1 | 0 |
| 1 1 1 1 | | 0 | 0 | 0 | 0 | 0 | 0 | 0 | 0 | 0 | 0 | 0 | 0 | 0 | 0 | 0 | 0 |

FIG. 12

LOGIC WAVEFORM DISPLAY APPARATUS

BACKGROUND OF THE INVENTION

1. Field of the Invention

The present invention relates generally to a logic waveform display apparatus, more specifically to an apparatus for displaying a logic signal on a raster scan type display device associated with a logic analyzer or the like.

2. Description of the Prior Art

In various kinds of electronic apparatus, logic signal processing techniques have become increasingly popular as a result of the development of microprocessors and computers. Oscilloscopes, logic probes and logic analyzers are utilized for developing, calibrating and trouble-shooting electronic apparatus which employs digital logic circuits. In addition, logic analyzers are ideal for measuring the performance of such electronic apparatus, because they can store multi-channel input logic signals (data) in an acquisition memory and can display the data stored in the memory, on a display means such as a cathode ray tube (CRT) so that the data, before the occurrence of the trigger signal, can be viewed. There are two display modes in logic analyzers, one being a timing display mode for displaying the logic signal as a signal waveform, and the other being a state display mode for displaying the stored data alphanumerically as binary, octal or hexadecimal words.

A raster scan display device is a suitable display means for logic analyzers, since the raster scan display device can display the data in both timing and state display modes, and is flicker free even if a great deal of information is displayed. Moreover, a raster scan display device is capable of inverting a monochromic display (black and white) with respect to the entire display or a part thereof, and can also blink the entire display or selected portions thereof.

In a conventional logic waveform display apparatus, a logic waveform train displayed on the CRT consists of a plurality of segments, and all kinds of the waveform patterns in one segment have been previously stored in a waveform (Character) read only memory (ROM). The waveform patterns in the ROM are addressed in accordance with a code signal, namely, FONT information. When the input logic signal in the acquisition memory is displayed as the timing waveform on the CRT, the input logic signal is divided into a plurality of segments and each segment is converted into FONT information. This FONT information is stored in a display RAM sequentially. The contents (FONT information) of the display RAM are read repeatedly in synchronism with the raster scan operation, and are applied to the address terminals of the waveform ROM for generating the waveform patterns as an intensity control signal. The CRT displays the logic waveform in response to the intensity control signal and the raster scan operation.

This prior art has many disadvantages. One disadvantage is that a large capacity ROM is needed, since all kinds of waveform patterns for the display segment must be stored. A large capacity ROM is expensive. If one logic waveform segment (FONT) consists of many waveform elements, the variety of the waveform patterns increases and a much larger capacity ROM is needed. Another disadvantage lies in the time consuming software manipulations needed to read the logic signal (data) from the acquisition memory and then convert the logic signal to FONT information. Thus, it is difficult to display the logic waveform with high speed horizontal scrolling, since the contents of the display RAM must be changed in accordance with the scrolling and this takes time. Moreover, the display RAM must be rewritten to magnify the displayed logic timing waveform.

A glitch detector of the logic analyzer detects glitches (narrow pulses affecting logic operation), and the detected glitches are displayed simultaneously with the displayed logic waveform i.e., the glitches are superimposed on the logic waveform. The conventional logic waveform display apparatus treats the glitches as ATTRIBUTE information, so that an additional circuit is needed for processing the ATTRIBUTE information. Thus, the prior art is not only expensive, but also complex in its construction.

On the other hand, graticule tick marks are useful to measure the timing of the displayed logic waveform. The conventional logic waveform display apparatus displays the tick marks on the CRT with complex software similar to the logic waveform display. In other words, complex patterns of the tick marks are stored in the ROM and the tick marks are handled as FONT information.

SUMMARY OF THE INVENTION

According to the logic waveform display apparatus of the present invention, a memory means such as a ROM stores a simple pattern determined in accordance with a raster line position (upper, middle and lower raster lines), a present pixel (dot) bit of an input logic waveform and the former (or next) pixel bit thereof. The upper, middle and lower raster lines of the logic waveform display correspond to a "High" (1) level, transitions (positive and negative going edges) and a "Low" (0) level, respectively. The ROM receives at the address terminals the present and former bits and the raster line information. The ROM stores results of logic ORs of the present and former bits in the upper raster line addresses, i.e., the stored data is "1" (unblanking) if at least one of the present and former bits is "High". The ROM stores results of logic exclusive ORs of the present and former bits in the middle raster line addresses, i.e, the stored data is "1" if the present and former bits are different from each other. The ROM stores results of logic NANDS of the present and former bits in the lower raster line addresses, i.e., the stored data is "1" if at least one of the present and former bits is "Low". The stored data is "0" (blanking) at the other addresses. The present bit is the input logic signal, and the former bit is obtained from a D type flip-flop receiving the input logic signal and a pixel clock pulse at the D input and clock terminals, respectively. The raster line information is obtained by counting a horizontal sync or blanking signal and processing the counted data. Since a plurality of logic waveforms are displayed on the CRT simultaneously, the raster line information is common for each of the logic waveforms. It should be noted that the pixel clock frequency is twice the input logic frequency, because the width of the displayed edge is less than one bit of the logic waveform. In addition, it should be understood that the logic input signal and the pixel clock are synchronized with the raster scan operation.

In a preferred embodiment of the present invention, the ROM stores the data for additional upper and lower raster lines. The data is "0" (blanking) for providing a space between the displayed logic waveforms. The input logic signal may be the read-out signal from the display RAM. In this instance, it is not necessary to convert an acquired logic signal to FONT information for storing it in the display RAM. Accordingly, the present invention can accept logic signals from the acquisition memory with very little manipulation by software thus making high speed horizontal scrolling possible.

The present invention can display the graticule tick marks easily by applying a square-wave signal as the input logic signal to the ROM and deleting the data at the upper and lower raster lines, wherein square-wave signal changes its logic level between "High" and "Low" every bit. Moreover, the present invention can display glitches without using the ATTRIBUTE technique, i.e., the glitch pattern is stored in the ROM and addressed by the glitch information.

The present invention provides an improved logic waveform display apparatus which displays a logic signal as a timing waveform on a raster scan display device. The present invention also provides a logic waveform display apparatus which can access a memory means having stored therein a simple pattern by means of an input logic signal without converting the input logic signal to FONT information. The present invention further provides a logic waveform display apparatus which has high speed horizontal scrolling capabilities, and provides a logic waveform display apparatus for a logic analyzer which can display glitches and graticule tick marks easily on a raster scan display device simultaneously with a displayed logic waveform. Other features of the present invention will become apparent to those having ordinary skill in the art when taken in conjunction with the accompanying drawings.

BRIEF DESCRIPTION OF THE DRAWINGS

A full understanding of the present invention will be obtained from the detailed description given hereinbelow and the accompanying drawings, which are given by way of illustration only, and are not limiting on the present invention, and wherein:

FIG. 8 shows the third contents of the memory means used in the present invention;

FIG. 12 shows the fifth contents of the memory means used in the present invention.

DETAILED DESCRIPTION OF THE PREFERRED EMBODIMENTS

Figure 1:
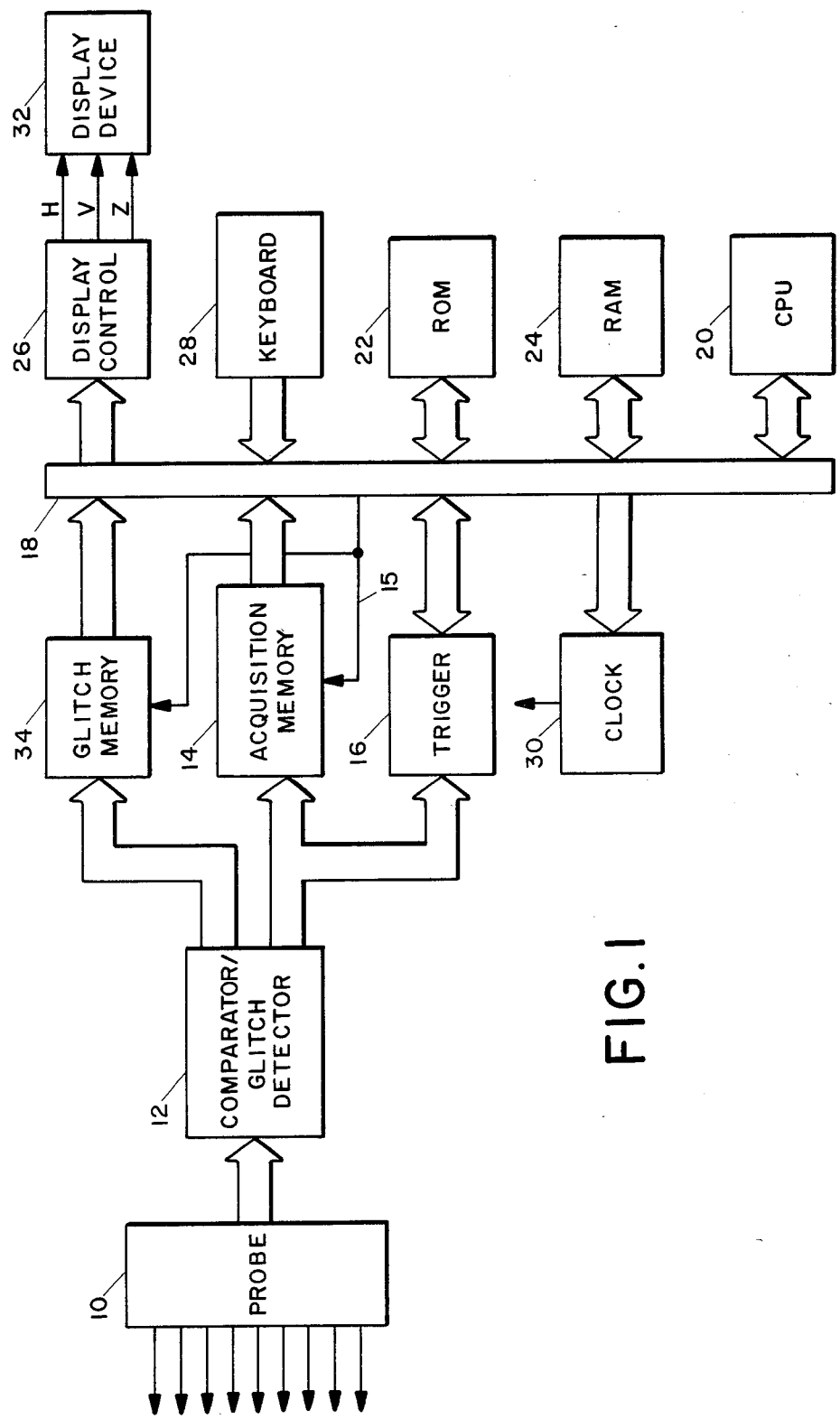
FIG. 1 shows a block diagram of a logic analyzer utilizing the present invention.

Referring to FIG. 1, there is shown a block diagram of a logic analyzer utilizing the present invention. The logic input signals detected by probe 10 are applied to comparator/glitch detection circuit 12. Circuit 12 compares the logic input signals with a predetermined level to adjust them to a predetermined logic level (such as the TTL level) proper for each block so as to apply them to acquisition memory 14 and trigger circuit 16, and detects glitches from the input signals to apply the glitches to glitch memory 34.

Memories 14 and 34 consist of high speed Random-Access-Memories (RAMs), and trigger circuit 16 includes a word recognizer and a counter. When trigger circuit 16 detects a desired word from the input signals, it generates a write stop signal. This write stop signal is applied to acquisition memory 14 and glitch memory 34 through bus 18 (for transmitting data, address and control signals) and line 15 so as to stop the acquisitions of memories 14 and 34. Memories 14 and 34 further receive a write command signal via line 15. Bus 18 is connected to central processing unit (CPU) 20, such as type 8080 microprocessor, and to the various other devices shown in FIG. 1 and serves to transfer data, addresses, and control signals between the connected units. The 8080 microprocessor is fully described in "MCS-80 User's Manual" published by the Intel Corporation. CPU 20 acts as logic arithmetic and processing means for controlling the entire system by using RAM 24 as a temporary memory in accordance with the firmware (processing procedure) of ROM 22. Keyboard 28 is an external input device for inputting data, control signals or the like by an operator. Clock signal generator 30 applies a clock signal to each block, wherein the clock signal frequency is determined by a command signal from bus 18. Display control circuit 26 is connected to a raster scan display device 32, such as a CRT, and supplies a horizontal ramp signal H, a vertical ramp signal V and an intensity signal Z as described hereinafter. RAM 24 includes a display area.

The operation of the logic analyzer shown in FIG. 1 will be discussed beginning with input data acquisition and ending with the input data being displayed on the CRT. An operator connects probe 10 to a circuit to be measured. The remaining sequential steps in the operation of the logic analyzer are as follows:

(1) When the operator enters the acquisition instruction via keyboard 28, the write (acquisition start) command signal is applied to acquisition and glitch memories 14 and 34 from CPU 20.

(2) Memories 14 and 34 acquire the input logic signal and the glitch from circuit 12 in accordance with the write command signal, and store them sequentially in predetermined memory areas.

(3) When trigger circuit 16 detects the trigger word from the input data and counts a predetermined number of the clock signals, trigger circuit 16 applies the write stop signal to memories 14 and 34.

(4) Memories 14 and 34 stop acquiring the logic signal and the glitch in accordance with the write stop signal.

(5) The operator instructs the system to display the data, stored in memories 14 and 34, via keyboard 28.

(6) CPU 20 transfers the stored data in memories 14 and 34 to the display area in RAM 24. The contents of the RAM display area are displayed on display device 32 through display control circuit 26.

Figure 2:
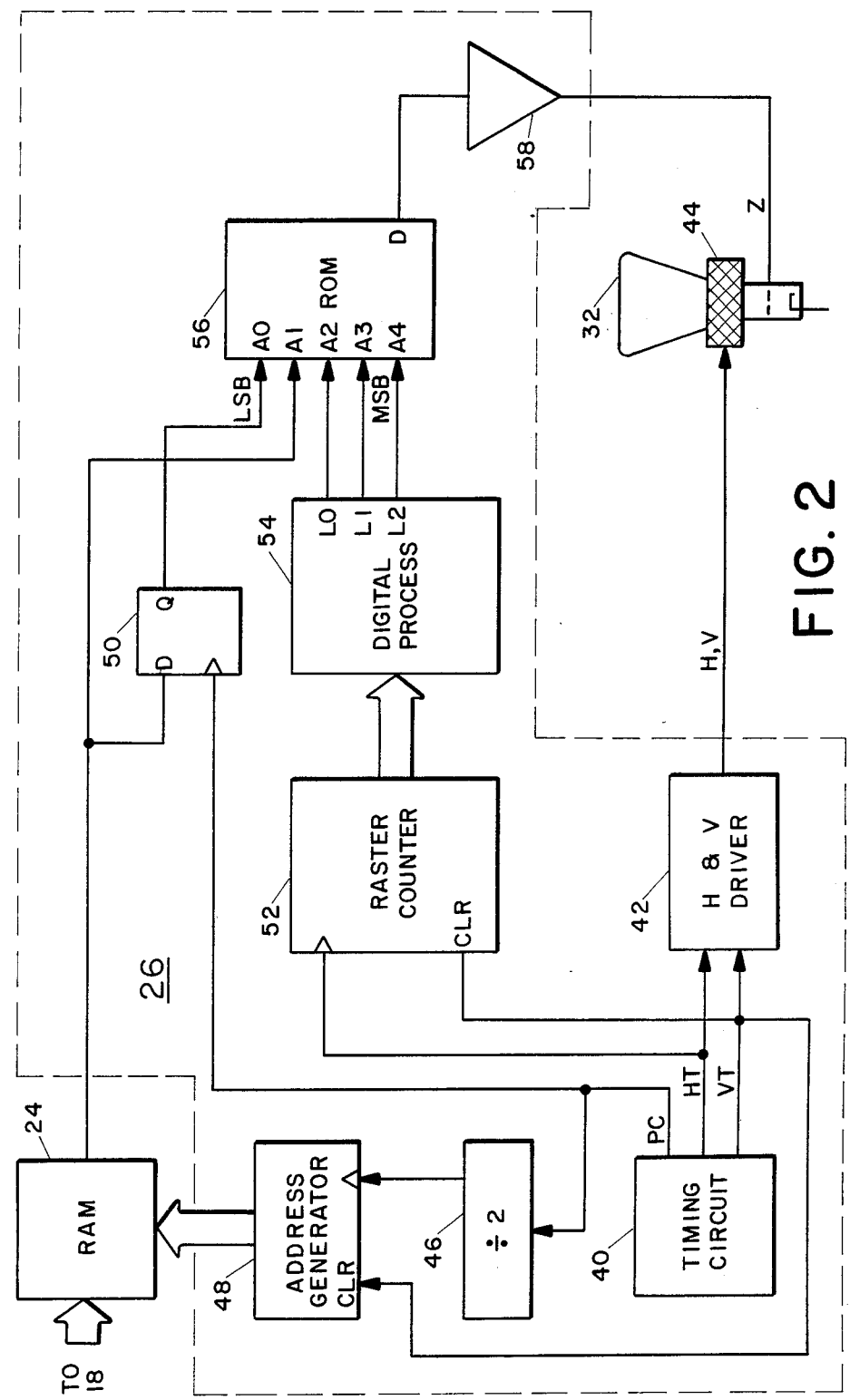
FIG. 2 shows a block diagram of one preferred embodiment of the display control circuit according to the present invention.

As is understood from the above explanation of operation, the present invention relates to the sixth step. FIG. 2 is a block diagram of a first embodiment of the present invention which corresponds to RAM 24, display control circuit 26 and CRT 32 of FIG. 1. Display timing circuit 40 includes a reference frequency oscillator and frequency dividers to generate a horizontal timing signal HT and a vertical timing signal VT for raster scan operation. These signals, HT and VT, are applied to horizontal and vertical driver 42. Driver 42 may be a conventional circuit which generates a horizontal ramp sigal H and vertical ramp signal V in response to the timing signals HT and VT. The ramp signals H and V are applied to yoke 44 provided at CRT 32 for forming the raster lines on the screen. Timing circuit 40 further generates a pixel (image dot on the CRT screen) clock signal, PC, in synchronism with the raster scan operation. The frequency of the pixel clock signal, PC, is divided by two with frequency divider 46 which may be a flip-flop. Address generator 48 is a binary counter which receives the divided pixel clock signal from frequency divider 46 at the clock terminal and the vertical timing signal VT from timing circuit 40 at the clear terminal. The binary output signal from address generator 48 is an address signal to access the display area of RAM 24. It should be noted that the display area of RAM 24 is addressed by a signal from address generator 48 instead of CPU 20. As is described hereinbefore, the RAM display area stores the acquired logic signal transferred from acquisition memory 14. The data output from RAM 24 is an input logic signal to the logic waveform display apparatus of the present invention.

Since D-type flip-flop 50 receives the input logic signal from RAM 24 at the D input terminal and the pixel clock signal, PC, at the clock terminal, the Q output signal therefrom is delayed by one cycle of the pixel clock and is used as a former bit. Raster counter 52 counts the horizontal timing signal, HT, and is reset by the vertical timing signal, VT, for generating information of the raster line number (position). Since CRT 32 displays a plurality of logic waveforms simultaneously on one screen, the raster lines are divided into a plurality of groups, each displaying a different logic waveform. Thus, it is necessary to obtain information on the raster line number for each group. To this end, optional digital process circuit 54 processes the output signal from raster counter 52. Circuit 54 may be constructed by flip-flops, gates, adders, etc. Assuming that one raster group consists of eight raster lines, including the upper and lower raster lines for the spaces, one field of the raster scan display consists of two hundred raster lines with eight logic waveforms displayed on CRT 32, the first raster line of the first logic waveform is, for example, the sixty-eighth raster line, then the first raster line of the second logic waveform is the seventy-sixth raster line, etc., and the first raster line of the eighth logic waveform is the one-hundred and twenty-fourth raster line. Circuit 54 performs the above-described function, i.e., the eight-bit output signal from raster counter 52 is converted to the three-bit signal (L0, L1 and L2) by digital process circuit 54 for generating the raster line number for each of the logic waveform groups.

Memory means 56 such as a ROM receives the former bit from D flip-flop 50 at the address terminal A0, the present bit from RAM 24 at the address terminal A1, and the raster line position information L0 through L2 from digital process circuit 54 at the address terminals A2 through A4. The LSB and MSB of the address signal correspond to the terminal A0 and A4, respectively. The contents of ROM 56 will be discussed hereinafter. The addressed data in ROM 56 is applied as the intensity signal Z to the grid of CRT 32 through amplifier 58.

Figures 3, 4:
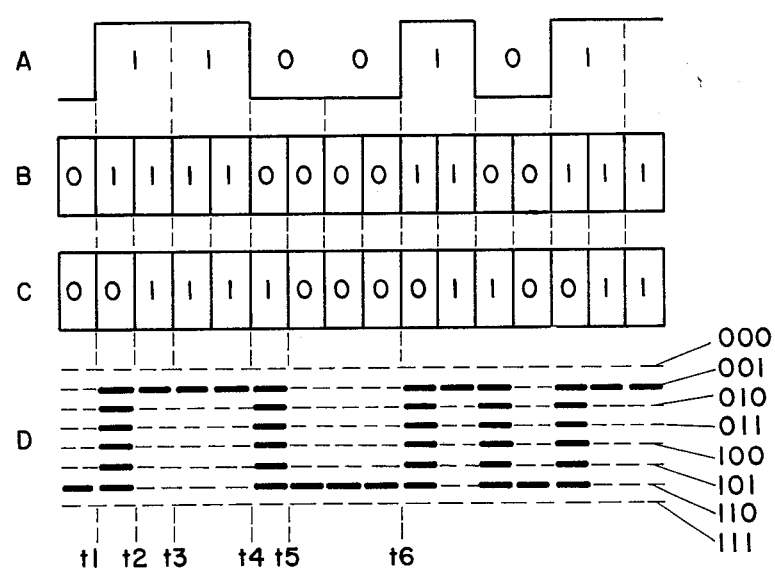
FIG. 3 shows first contents of a memory means used in the present invention.
FIG. 4 shows a time chart for explaining the operation of the present invention in conjunction with FIG. 3.

FIG. 3 shows one example of the contents of ROM 56. In this table, the column is determined by the addresses A0 and A1 (the former and present bits), and the row is determined by the addresses A2 through A4 (the raster line position). For example, when the address signal is "11000", the output is "1". FIG. 4 is a time chart for explaining the operation relating to FIG. 3. This time chart indicates a part of one logic waveform. In FIG. 4, a logic waveform A is the input logic signal from RAM 24, and B and C represent the present and former bits, respectively. It should be noted that the frequency of the pixel clock is twice the frequency of the input logic signal. Since RAM 24 is read repeatedly in synchronism with the raster scan operation, the same logic signal is output from RAM 24 for each raster line.

When the raster scan position information (the three MSBs (A4, A3, A2) of the address signal) is "000" or "111", the data output is "0" regardless of the former and present bits (the two LSBs (A1, A0) of the address signal). Thus, the upper and lower raster lines are blanked as shown in FIG. 4D, wherein thin (dotted) lines indicate "blanking" and thick lines indicate "unblanking". In the second raster line, namely, the first of the middle raster lines, the position information is "001". The input logic signal A changes from "0" to "1" at a time t1, and maintains "1" from the time t1 to a time t4. Since the present bit B (A1) is "1" and the former bit C (A0) is "0" during a period between the times t1 and t2, the data output is "1" and thereby the second raster line is unblanked during the period. The present and former bits are "1" during a period between the times t2 and t4, so that the data output is "1" for unblanking the second raster line. In a period between the times t4 and t5, the present and former bits are respectively "0" and "1", and thereby outputting "1" as the data for unblanking the raster line. The data output is "0" and the raster line is blanked between the times t5 and t6, because both the present and former bits are "0". These operations are repeated, and the second raster line is completed. As is understood from the above description, the data output of the second raster line (upper raster line of the logic waveform) is determined by logic ORs of the present and former bits.

When the third raster line is scanned, the raster line position information is "010". The data output from ROM 56 is "1" in the periods (t1–t2) and (t4–t5) thereby unblanking the third raster line. The raster line in the periods (t2–t4) and (t5–t6) is blanked because the data output is "0". The operations of the fourth, fifth and sixth raster lines are the same as the operation of the third raster line. As is understood, the data stored of the middle raster lines (third through sixth raster lines) in ROM 56 is determined in accordance with logic exclusive-ORs of the present and former bits.

The raster line position information is "110" at the seventh raster line. The data output is "1" for the period (t1–t2) since the present and former bits are respectively "1" and "0", and thereby unblanking the seventh raster line. This raster line is blanked for the period (t2–t4) in response to the data output "0", because both the present and former bits are "1". In the period (t4–t5), the data output is "1" since the present and former bits are respectively "0" and "1". The data output is "1" in the period (t5–t6), since both the present and former bits are "0". Thus, the seventh raster line is unblanked for the period (t4–t6). The data in ROM 56 corresponding to the seventh raster line (the lower raster line of the logic waveform) is determined in accordance with logic NANDs of the present and former bits. The above operations are repeated for the other part of the input logic signal A and the other logic signals from RAM 24. In this embodiment, RAM 24 generates the same logic signals for eight raster line groups.

As is understood, it is not necessary to convert the input logic signal to FONT information, and the contents of ROM 56 are very simple. Moreover, the width of the displayed edge is a half of one bit of the input logic signal because the pixel clock frequency is twice the input logic frequency, so that the "High" and "Low" levels of the displayed logic waveform can be distinguished even if the logic levels change every one bit.

Figures 5, 6:
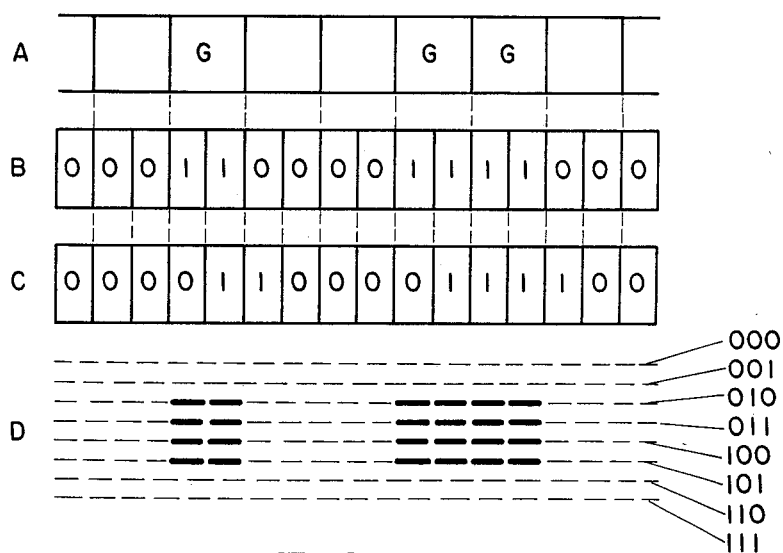
FIG. 5 shows the second contents of the memory means used in the present invention.
FIG. 6 shows a time chart for explaining the operation of the present invention in conjunction with FIG. 5.

FIG. 5 shows the contents of ROM 56 according to another example of the present invention. In this instance, the display area of RAM 24 stores the glitch information transferred from glitch memory 34 in FIG. 1. The operation of this case will be discussed by reference to a time chart shown in FIG. 6. In FIG. 6, a bar data A indicates the glitch information stored in RAM 24, wherein "G" is the glitch corresponding to "1". As described hereinbefore, the pixel clock frequency is twice the frequency of the logic signal from RAM 24. Bar data B indicates the present bit output from RAM 24 clocked by the pixel clock, and bar data C indicates the former bit delayed by D-flip-flop 50. This operation is similar to the operation of FIGS. 3 and 4, however, the data output from ROM 56 is "0" regardless of the present and former bit, when the three MSBs of the address signal (A4, A3, A2) are "000", "001", "110", or 111, i.e., while the first, second, seventh and eighth raster lines are scanned. As is understood from the display on CRT 32 shown in FIG. 6D, the glitch is displayed as an unblanked square consisting of 2×4 dots.

Figure 7:
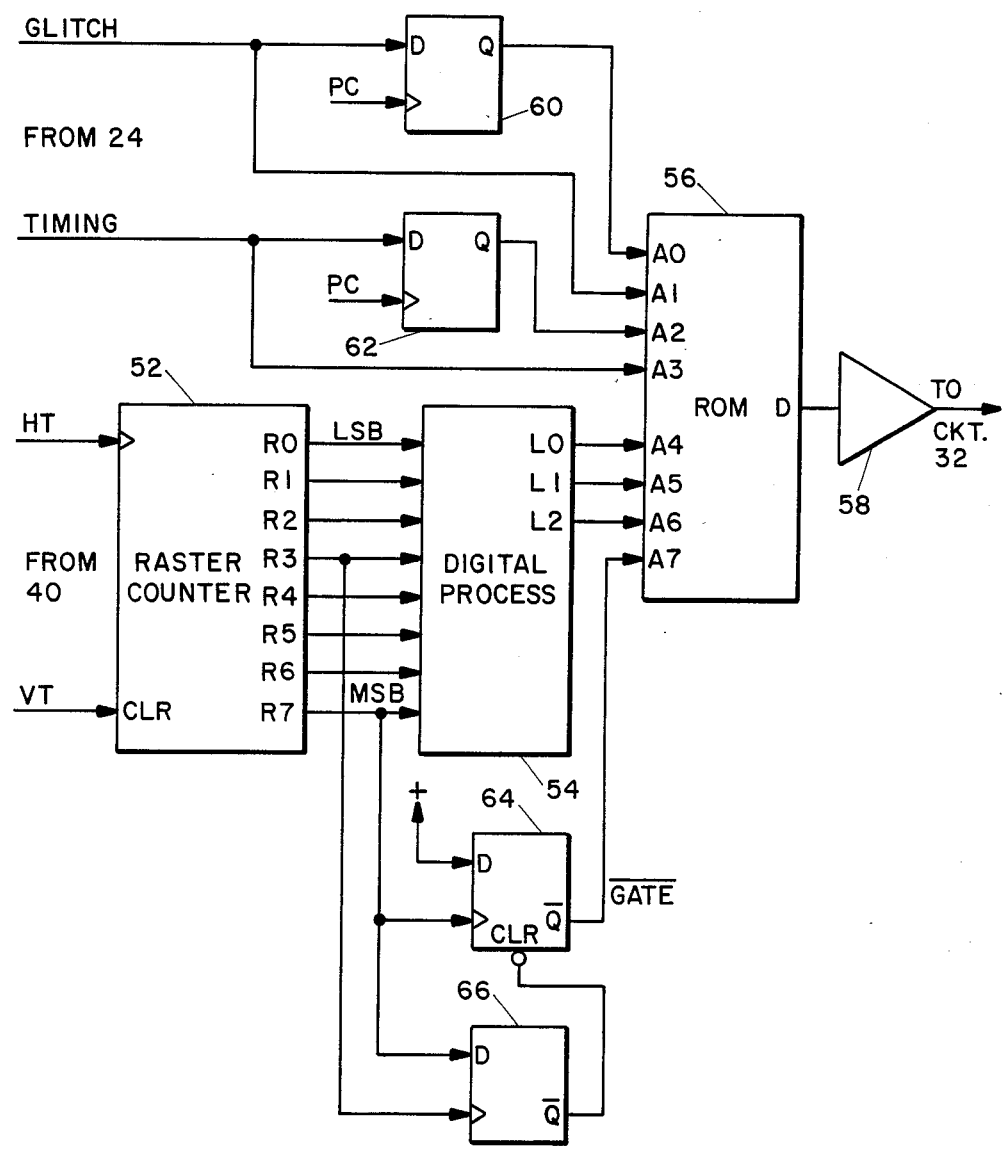
FIG. 7 shows a block diagram of a second preferred embodiment according to the present invention.

FIG. 7 is a block diagram of a second embodiment according to the logic waveform display apparatus of the present invention. Since this embodiment is a modification of the first embodiment shown in FIG. 2, only the different portion is shown and will be discussed. The logic signal of the glitch information is applied from the display area of RAM 24 to the D terminal of D flip-flop 60 and the address terminal A1 of ROM 56. The logic signal of the timing information is applied from the display area of RAM 24 to the D terminal of D flip-flop 62 and the address terminal A3 of ROM 56. Flip-flops 60 and 62 are clocked by the pixel clock, PC, from timing circuit 40 in FIG. 2 for delaying the input logic signals, i.e., for forming the former bits. The former bits from the Q terminals of flip-flops 60 and 62 are respectively applied to the address terminals A0 and A2 of ROM 56. Similarly to FIG. 2, raster counter 52 receives the horizontal and vertical timing signals, HT and VT, from timing circuit 40, and generates the eight-bit digital signal (R0-R7) representing the raster line number in the entire screen of CRT 32. In the digital signal, the R0 and R7 correspond to LSB and MSB, respectively. Digital process circuit 54 applies the raster line position information (three-bit digital signal L0–L2) to the address terminals A4, A5 and A6 of ROM 56 in accordance with the output signal from raster counter 52. This embodiment further includes two additional D flip-flops 64 and 66. The D terminal of flip-flop 64 is tied to a "High" potential, the digital signal R7 is applied to its clock terminal and the $\bar{Q}$ output signal from flip-flop 66 is applied to its clear terminal. Flip-flop 66 receives the digital signal R7 at its D terminal and the digital signal R3 at its clock terminal. The $\bar{Q}$ output signal from flip-flop 64 is applied to the address terminal A7 of ROM 56 and the data output D of ROM 56 is applied to the Z axis grid of CRT 32 through buffer amplifier 58. This embodiment combines both the glitch and timing information.

Figure 9:
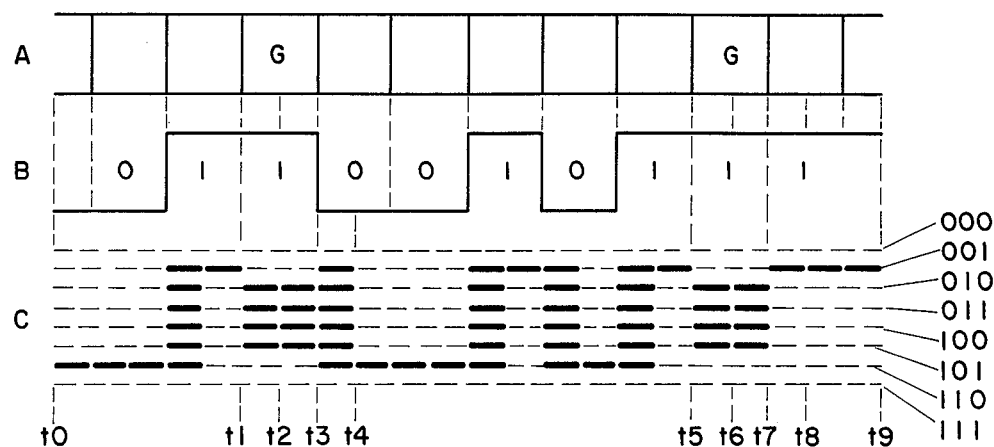
FIG. 9 shows a time chart for explaining the operation of the present invention in conjunction with FIG. 8.

For this end, the contents of ROM 56 are changed as shown in FIG. 8. The operation will be discussed by reference to a time chart of FIG. 9, wherein A, B and C represent the glitch information, the timing logic signal, and the display on CRT 32 respectively. It should be noted that the address terminal A7 of ROM 56 is ignored in this case.

In a period between times t0 and t1, the glitch does not exist, and the display on CRT 32 is determined only by the former and present timing bits (A2, A3) and the raster line position information (A4, A5, A6). In other words, the contents of ROM 56 is the same as in the case of FIG. 3, when both the former and present glitch bits (A0, A1) are "0". Since the glitch exists between times t1 and t3, the glitch bits at A0 and A1 are respectively "0" and "1" for a period between the times t1 and t2, and both the glitch bits at A0 and A1 are "1" for the period (t2–t3). In the glitch period (t1–t3), the timing bits at A2 and A3 are ignored, and the glitch is displayed as described in the case of FIGS. 5 and 6. Therefore, the contents of ROM 56 are the same as the case of FIG. 5, when the glitch bits at A0 and A1 are "01" and "11". The glitch does not exist in a period (t3–t4), however, and the glitch bits at A0 and A1 are "10". In this instance, the contents of ROM 56 are the same as the case of FIG. 3, and the logic timing is displayed on CRT 32. The operations of periods (t4–t5) and (t8–t9) are the same at the period (t0–t1), and the operations of a period (t5–t8) are the same as the period (t1–t4). Therefore, the present invention displays the logic waveform including the glitch information on CRT 32 as shown in FIG. 9C. As is understood, FONT and ATTRIBUTE information is not necesary to display the timing and glitch information, and thereby the present invention can accept the logic timing and glitch information with very little manipulation by software thus making high speed horizontal scrolling possible.

Figures 10, 11:
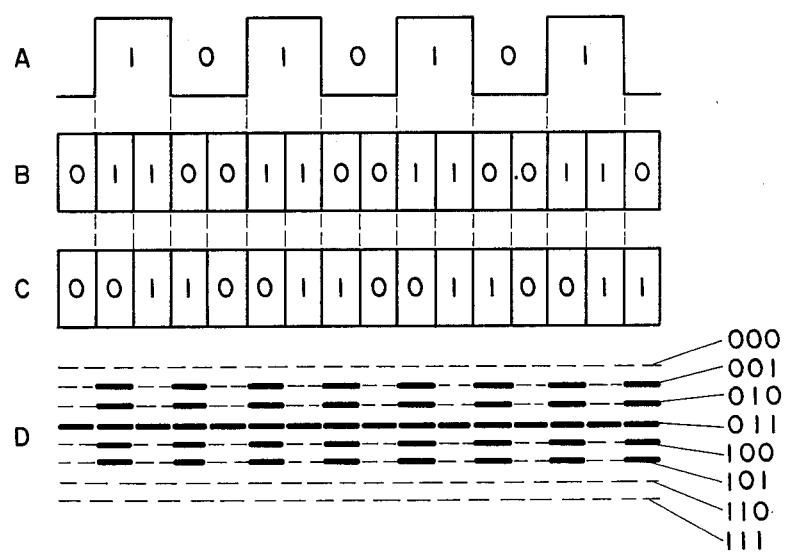
FIG. 10 shows the fourth contents of the memory means used in the present invention.
FIG. 11 shows a time chart for explaining the operation of the present invention in conjunction with FIG. 10.

The graticule tick marks are very useful to measure the timing of the logic waveforms. The present invention can display the marks easily. This operation will be described by reference to FIGS. 2, 10 and 11. In this instance, ROM 56 stores a pattern shown in FIG. 10, and the display area of RAM 24 stores a square wave with the logic levels changing between "0" and "1" every one bit. When RAM 24 generates a logic signal shown in FIG. 11A, ROM 56 receives the present bit (FIG. 11B) and the former bit (FIG. 11C) at the address terminals A1 and A0. In accordance with the table of FIGS. 10, the graticule tick marks are displayed on CRT 32 as shown in FIG. 11D. It should be noted that the tick marks are displayed similarly to the logic timing or glitch information.

Figure 13:
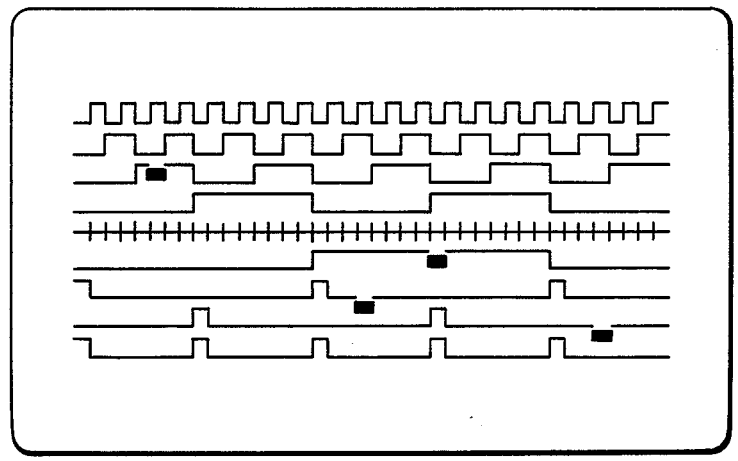
FIG. 13 shows a display on a CRT screen for explaining the operation of the present invention in conjunction with FIG. 12.

The logic waveform apparatus of the present invention can display the logic waveform, the glitch and the graticule tick marks as shown in FIG. 13, wherein the display screen is divided to nine longitudinal areas each consisting of eight raster lines. The center longitudinal area is used for displaying the graticule tick marks, and the other areas are used for the logic waveforms including the glitch information. The embodiment displaying the display of FIG. 13 will be discussed by reference to FIGS. 7 and 12. RAM 24 stores the logic signals and the glitches of eight channels and further stores a square-wave for the graticule tick marks. ROM 56 stores a pattern shown in FIG. 12. Flip-flops 64 and 66 detect the center longitudinal area in accordance with the digital signals R3 and R7 from raster counter 52. The address terminal A7 receives "0" for the eight raster line scanning periods when the center longitudinal area is scanned. When the center longitudinal area is scanned, RAM 24 generates the square-wave and the graticule tick marks are displayed as described by reference to FIGS. 10 and 11. It should be noted that the contents of ROM 56 are the same as FIG. 10 regardless of the present and former glitch bits (A0, A1) when the $\overline{Q}$ output from flip-flop 64 (A7) is "0". While the other longitudinal areas are scanned for dispaying the logic waveforms, including the glitch information, the digital signal at the terminal A7 of ROM 56 is "1". RAM 24 generates both the logic signal and the glitch information for every raster line, as it is read repeatedly in synchronism with the raster scan operation. Since the contents of ROM 56 are the same as FIG. 8 in this case, the logic waveforms and the glitch information are displayed as described by reference to FIGS. 8 and 9. Thus, the display of FIG. 13 is completed. The $\overline{Q}$ output from flip-flop 64 acts as a $\overline{GATE}$ signal.

As is understood from the foregoing description, the logic waveform display apparatus of the present invention can display a logic timing waveform with glitch information and graticule tick marks on a raster scan display device, such as a CRT, without converting them to FONT and ATTRIBUTE information. Thus, the data of the logic timing, glitch and tick mark information can be processed and displayed with very little manipulation by software, thereby making high speed horizontal scrolling possible. The contents of the display RAM need not be rewritten for horizontal scrolling. In addition, special circuitry is not needed for processing the ATTRIBUTE of the glitch information, so that the present invention is simple in construction. Since a memory means stores only a simple pattern instead of all possible waveform patterns of each segment, the capacity of the memory means needed is small. Moreoever, the present invention can display graticule tick marks with a simple pattern stored in the memory means. The timing of the displayed logic waveform can be magnified easily by changing the frequency ratio of the pixel (dot) clock and the input logic signal, i.e., by changing the read-out frequency of the display RAM.

It will be obvious to those having ordinary skill in the art that many changes may be made in the above-described details of the preferred embodiments of the present invention. For example, a D flip-flop may be inserted between the data output of ROM 56 and buffer amplifier 58, wherein the flip-flop receives the output from ROM 56 at the D terminal and the pixel clock signal at the clock terminal, and the Q output signal of the flip-flop is applied to buffer amplifier 58. Frequency divider 46 may be variable to magnify the displayed logic waveform. The memory means for the pattern may be ROM, PROM (programmable ROM), EPROM (erasable PROM), EEPROM (electrical EPROM) or RAM. However, if the memory means is the RAM, the necessary pattern must be written into the RAM before the display operation. The raster scan display device may also be a color CRT. In addition, each of the memory means may consist of a plurality of memory devices and logic gates. For example, a first memory device can be used to store the pattern of FIG. 3 and a second memory device can be used to store the pattern of FIG. 5. The logic gates pass the output from the first memory device when the former and present glitch bits (A0, A1) are "00" and "10", and pass the output from the second memory device when the bits (A0, A1) are "01" and "11". Thus, the data output of this modification is the same as the case of FIGS. 8 and 9. This modification can reduce the required memory capacity. The memory means of the above-described embodiments stores the results of a logic OR of the present and former bits in areas corresponding to the upper raster line of the logic waveform, the results of a logic exclusive OR in areas corresponding to the middle raster line, and the results of a logic NAND in areas corresponding to the lower line. However, the memory means may store the results of logic NOR, exclusive NOR and AND of the present and former bits in the areas corresponding to the upper, middle and lower lines, respectively, if the negative data output from the memory means is needed. Therefore, the scope of the present invention should be determined only by the following claims.

We claim:

1. An apparatus for displaying a logic waveform of an input logic signal consisting of digital bits on a raster scan display device, comprising:
   delay means for receiving said input logic signal and providing a delayed logic signal; and
   addressable memory means containing a predetermined pattern of logical ones and zeros to provide pixel turn-on and turn-off levels, respectively;
   wherein said logical ones and zeros are selected in accordance with said input logic signal, said delayed logic signal, and raster line position information received at the address terminals of said memory means.

2. An apparatus according to claim 1 further including means for generating a clock signal in synchronism with a scanning operation of said raster scan display device, wherein said delay means comprises a D-type flip-flop for receiving said input logic signal and said clock signal at its D and clock terminals, respectively, and for generating said delayed logic signal at its Q output terminal.

3. An apparatus according to claim 1, wherein said memory means is a read only memory.

4. An apparatus according to claim 1, wherein said input logic signal is read out from a display memory means.

5. An apparatus according to claim 1, wherein said memory means includes an additional memory area for storing glitch information, and receives a glitch signal at an address terminal for addressing said additional memory area.

6. An apparatus according to claim 1, wherein said memory means includes an additional memory area for storing tick mark information, and receives a tick mark signal at an address terminal for addressing said additional memory area.

7. An apparatus according to claim 2 wherein said clock signal is a pixel clock signal having a frequency directly related to the raster line pixel spacing.

* * * * *